(12) United States Patent
Huang

(10) Patent No.: US 7,070,437 B1
(45) Date of Patent: Jul. 4, 2006

(54) CPU SOCKET WITH GUIDING SLOTS AND GUIDING BOSSES TO ENSURE SMOOTH MOVEMENT OF THE COVER RELATIVE TO THE BASE

(76) Inventor: Huang-Chou Huang, No. 377, Fu-Teh First Rd., Hsi-Chih, Taipei Hsien (TW)

( * ) Notice: Subject to any disclaimer, the term of this patent is extended or adjusted under 35 U.S.C. 154(b) by 0 days.

(21) Appl. No.: 11/264,141

(22) Filed: Nov. 2, 2005

(51) Int. Cl.
*H01R 13/625* (2006.01)
*H01R 4/50* (2006.01)

(52) U.S. Cl. ..................... 439/342; 439/259

(58) Field of Classification Search .............. 439/342, 439/259–266
See application file for complete search history.

(56) References Cited

U.S. PATENT DOCUMENTS

| | | | |
|---|---|---|---|
| 6,338,640 B1 * | 1/2002 | Lin | 439/342 |
| 6,609,926 B1 * | 8/2003 | Chen et al. | 439/342 |
| 6,669,500 B1 * | 12/2003 | Ju | 439/342 |
| 6,814,603 B1 * | 11/2004 | Okita et al. | 439/342 |
| 6,921,276 B1 * | 7/2005 | McClinton | 439/342 |
| 2005/0186827 A1 * | 8/2005 | He et al. | 439/342 |
| 2005/0215102 A1 * | 9/2005 | Yu et al. | 439/342 |

* cited by examiner

*Primary Examiner*—Michael C. Zarroli
(74) *Attorney, Agent, or Firm*—Rabin & Berdo, P.C.

(57) ABSTRACT

A CPU socket having a base, a cover movable relative to the base and a driving element forcing the cover to move relative to the base. The guiding plate inside the base has two guiding bosses respectively formed on the guiding plate and separated by the first hole. The sliding plate inside the cover has two receiving slits defined in a bottom face of the sliding plate to receive therein the two guiding bosses of the guiding plate so as to ensure smooth movement of the cover relative to the base.

1 Claim, 7 Drawing Sheets

CPU SOCKET WITH GUIDING SLOTS AND GUIDING BOSSES TO ENSURE SMOOTH MOVEMENT OF THE COVER RELATIVE TO THE BASE

BACKGROUND OF THE INVENTION

1. Field of the Invention

The present invention relates to a CPU (central processing unit) socket, and more particularly to a CPU socket consisting of a cover and a base. The cover movable relative to the base and has a first elongated recess to receive therein a guiding plate with therein guiding slits and the base has a driven plate received in a second elongated recess to receive therein a driven plate with thereon a guiding bosses complementary to the guiding slits such that the guiding bosses are received in the guiding slits to regulate the movement of the cover in relation to the base.

2. Description of Related Art

With reference to FIG. 7, it is noted that a conventional CPU socket includes a base (40), a cover (50) and a driving element (60).

The base (40) has multiple first apertures (41) defined through the base (40), a first recess (42) defined in a top face thereof to receive therein a driven plate (43) and a first through hole (421) defined through a bottom face defining the first recess (42).

The cover (50) has a U shaped cross section and includes multiple second apertures (51) corresponding to the first apertures (41) for insertion of legs (not shown) of the CPU, a second recess (52) defined in a bottom face thereof to receive therein a driving plate (53A) and a second through hole (53) defined through a bottom face defining the second recess (52) to correspond to the first through hole (421).

The driving element (60) has a head (61), a cam (62) extending from a bottom of the head (61) and a rod (63) formed on a bottom of the cam (62).

When the conventional CPU socket is in application, the rod (63) is extended through the second through hole (53), the driving plate (53A), the driven plate (43) and the first through hole (421) to combine with a washer (631). Thus the head (61) is kept on top of the cover (50) and the cover (50) is securely connected with the base (40) via outer side walls of the cover (50) enclosing outer side walls of the base (40).

In order to facilitate the rotation of the driving element (60), a groove (64) is defined in a top face of the head (61) so that an auxiliary tool such as a screwdriver is applied to rotate the driving element (60). When the driving element (60) is rotated, the cam (62) will abut an inner periphery of the second through hole (53) to move the cover (50) relative to the base (40). Thus after the legs of the CPU are inserted into the second apertures (51) and the first apertures (41), the movement of the cover (50) relative to the base (40) will ensure that the legs engage with solder bosses formed on a bottom face of the base (40) (not shown).

From the above description, it is noted that the rotation of the driving element (60) ensures the contact between the CPU legs and the solder bosses. However, because the driving force comes from a point of the inner periphery of the second through hole (53), the movement of the cover (50) may easily be tilted relative to the base (40) such that either the side walls of the cover (50) are damaged or the periphery defining the second through hole (53) is damaged.

To overcome the shortcomings, the present invention tends to provide an improved CPU socket to mitigate the aforementioned problems.

SUMMARY OF THE INVENTION

The primary objective of the present invention is to provide improved CPU socket having a guiding slits and guiding bosses received in the corresponding guiding slits so that the movement of the cover in relation to the base is regulated.

Other objects, advantages and novel features of the invention will become more apparent from the following detailed description when taken in conjunction with the accompanying drawings.

DETAILED DESCRIPTION OF THE PREFERRED EMBODIMENT

Figure 1:
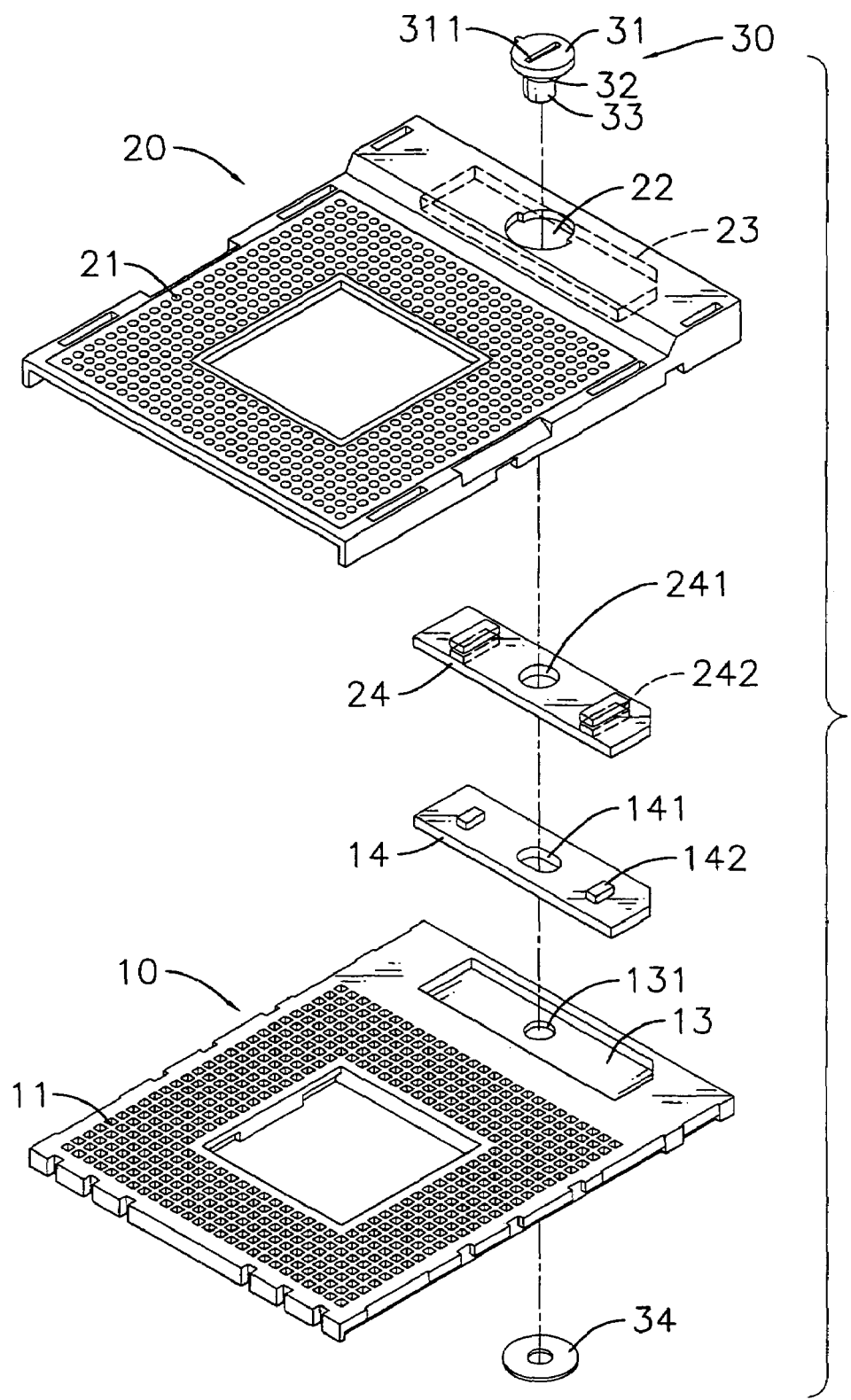
FIG. 1 is an exploded perspective view of the CPU socket.

With reference to FIG. 1, it is noted that the CPU socket in accordance with the present invention includes a base (10), a cover (20) and a driving element (30).

Figure 3:
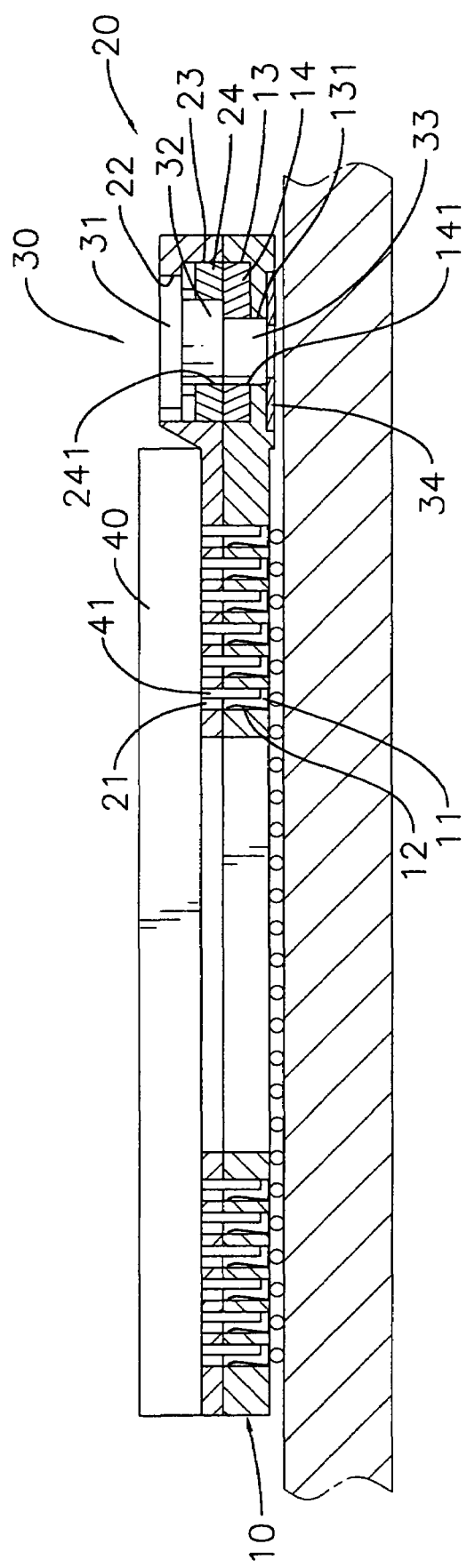
FIG. 3 is a schematic side plan view showing the application of the CPU socket with a CPU.

The base (10) has multiple first apertures (11) defined through the base (10) and each first aperture (11) having therein a metal contact (12) (as shown in FIG. 3), a first recess (13) defined in a top face thereof to receive therein a guiding plate (14) and a first through hole (131) defined through a bottom face defining the first recess (13). The guiding plate (14) has a first hole (141) defined to correspond to and align with the first through hole (131) of the base (10) and two guiding bosses (142) respectively formed on the guiding plate (14) and separated by the first hole (141).

The cover (20) has a U shaped cross section and includes multiple second apertures (21) defined through the cover (20) to correspond to the first apertures (11) of the base (10), a second recess (23) defined in a bottom face of the cover (20) to correspond to the first recess (13) of the base (10) and to receive therein a sliding plate (24) and a second through hole (22) defined through a bottom face defining the second recess (23) to correspond to the first hole (141) of the guiding plate (14) and the first through hole (131) of the base (10). The sliding plate (24) has a second hole (241) defined to correspond to and align with the first hole (141) and two receiving slits (242) defined in a bottom face of the sliding plate (24) to receive therein the two guiding bosses (142) of the guiding plate (14).

The driving element (30) includes a head (31) having thereon a groove (311), a cam (32) extending from a bottom of the head (31) and a rod (33) formed on a bottom of the cam (32).

Figure 2:
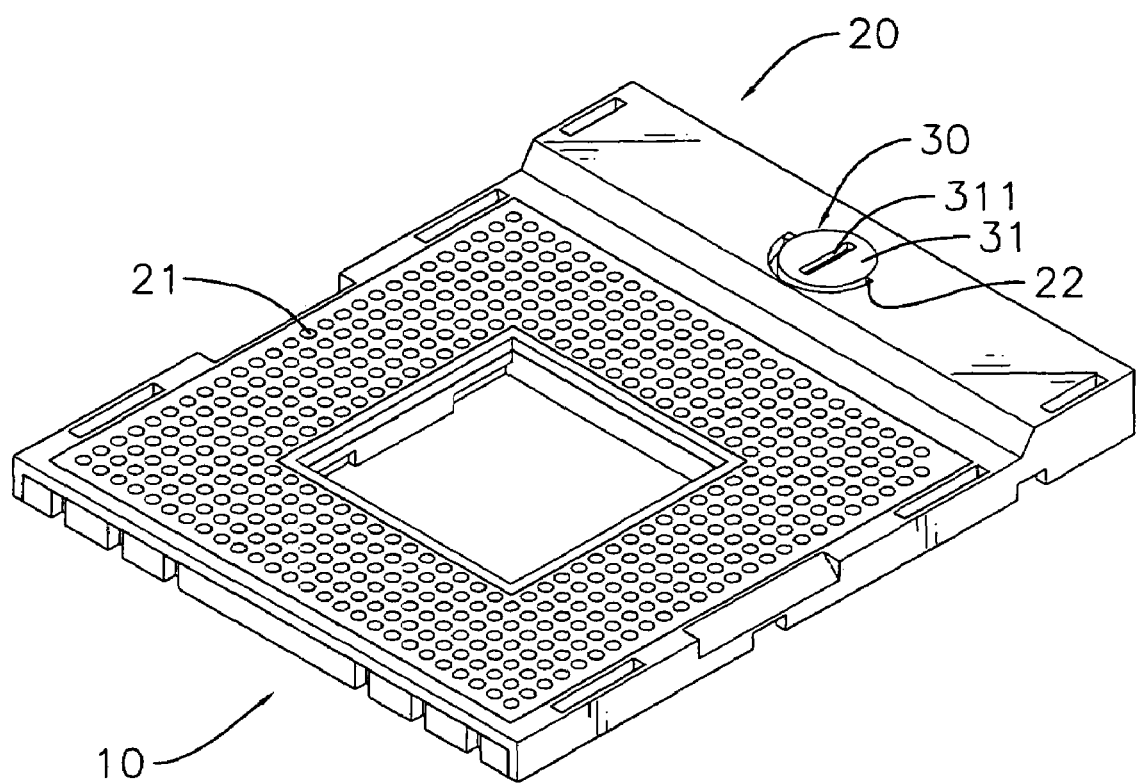
FIG. 2 is a perspective view of the CPU socket of the present invention.

With reference to FIGS. 2 and 3, when the CPU socket of the present invention is assembled, it is noted that the U shaped cover (20) is first placed on top of the base (10) to have outer peripheral side walls of the cover (20) to enclose outer peripheral side walls of the base (10). Thereafter, the rod (33) is extended through the second through hole (22), the second hole (241), the first hole (141) and the first through hole (131) to be combined with a disk (34) so as to secure engagement between the cover (20) and the base (10). Because the size of the head (31) is larger than that of the second through hole (22), the head (31) is kept on top of the cover (20). Meanwhile the guiding bosses (142) of the first guiding plate (14) are received in the receiving slits (242) of the sliding plate (24). With such an arrangement just described, when the legs (41) of the CPU (40) are inserted through the second apertures (21) and into the first apertures (11), the legs (41) are not in contact with the metal contacts (12) in the first apertures (11) of the base (10).

Figure 4:
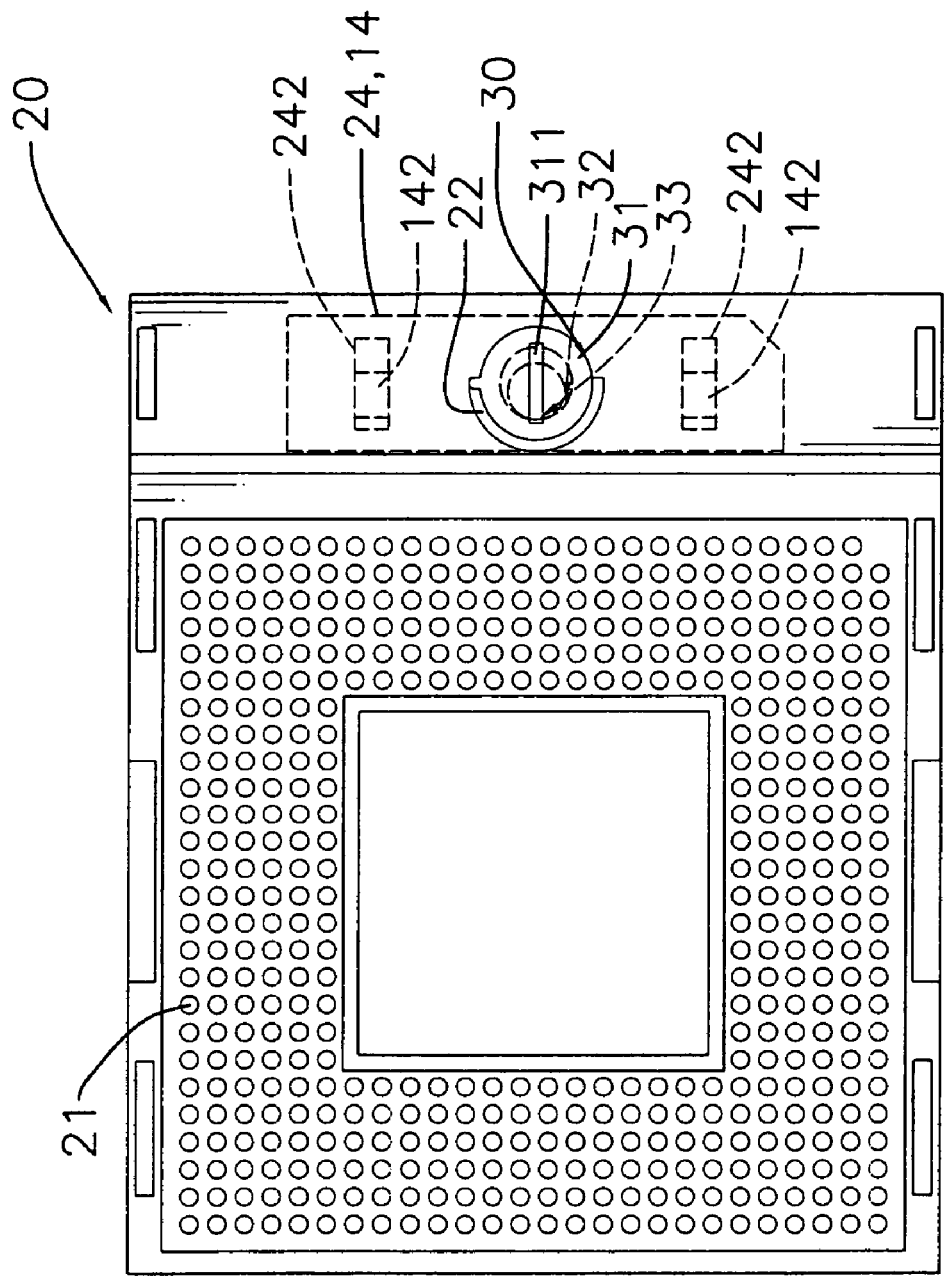
FIGS. 4, 5 and 6 are schematic views showing the movement of the cover relative to the base due to the rotation of the driving element.
Figure 5:
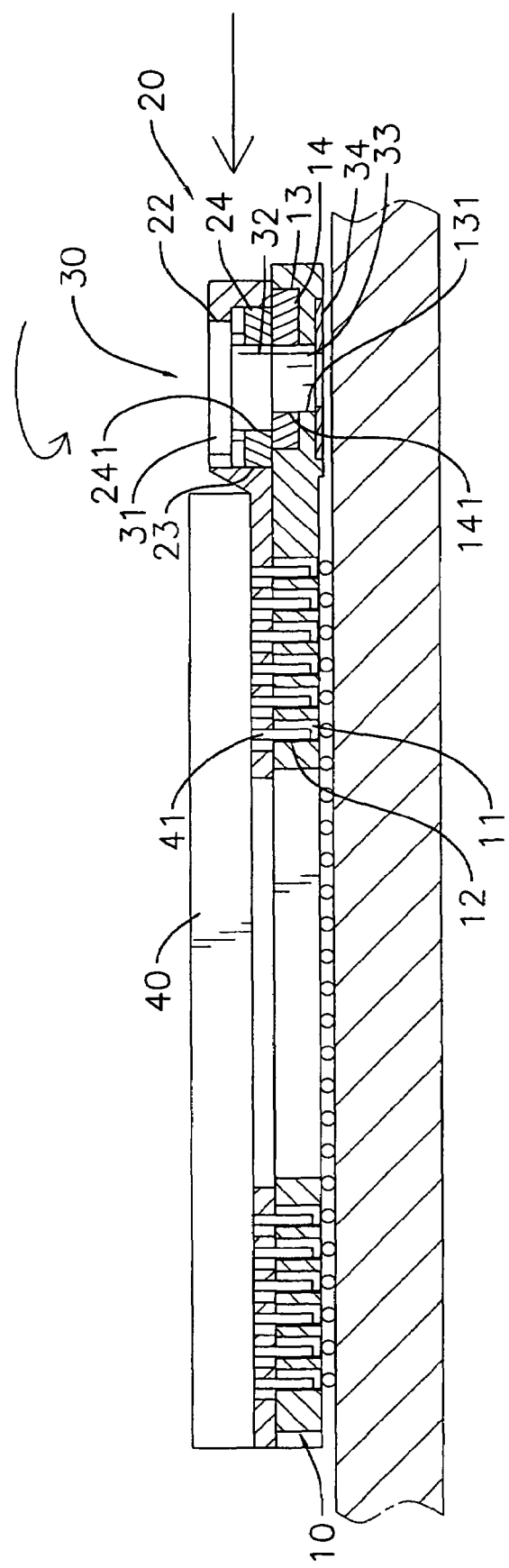
Figure 6:
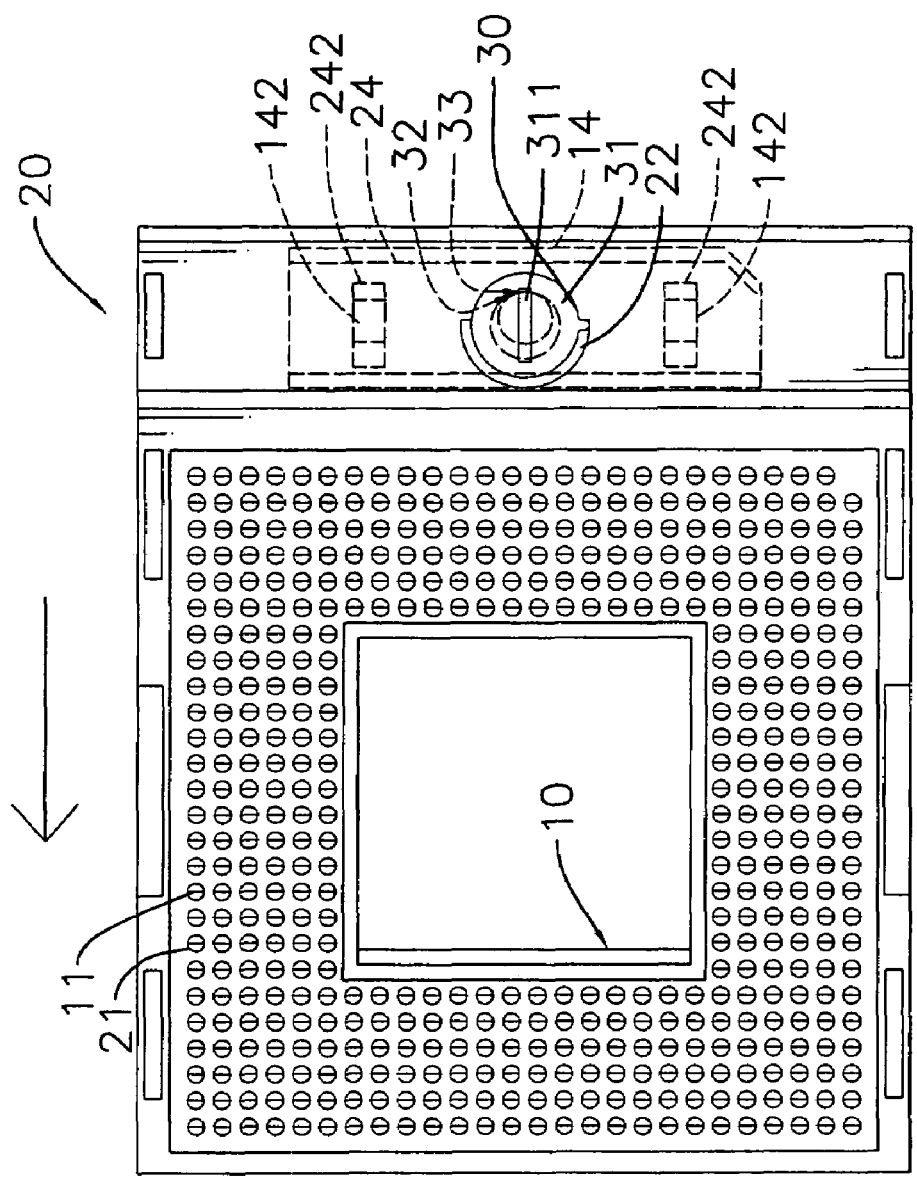
Figure 7:
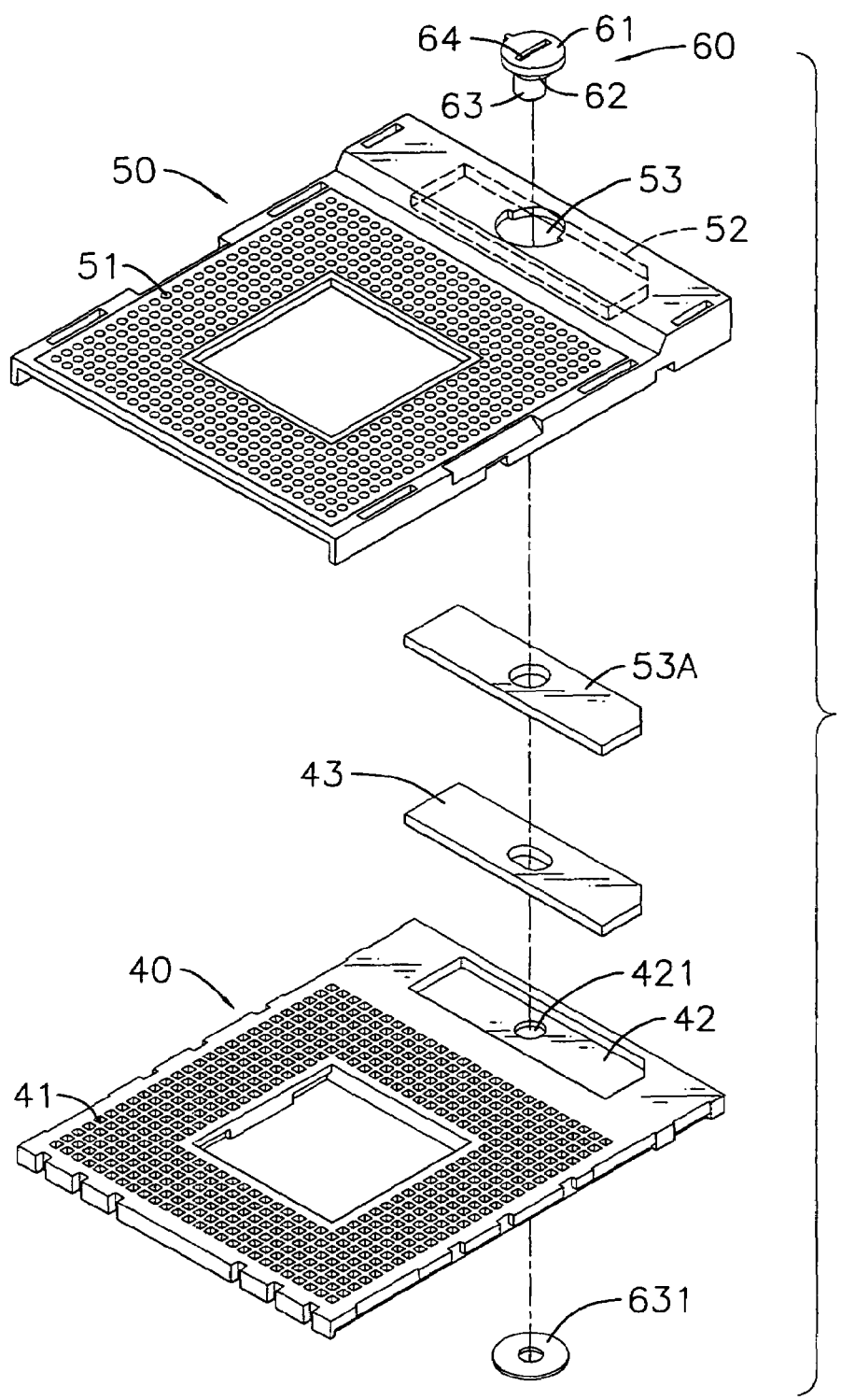
FIG. 7 is an exploded perspective view of a conventional CPU socket.

With reference to FIGS. 4 to 6, it is noted that an auxiliary tool, i.e. screwdriver, may be applied to the groove (311) of the head (31) to rotate the driving element (30). Therefore, due to the rotation of the head (31), the cam (32) will abut an inner periphery of the second through hole (22) to force the cover (20) to move in relation to the base (10). Thereafter, the legs (41) are in perfect contact with the metal contacts (12) in the first apertures (11).

Particularly, when the cover (20) is moved relative to the base (10), because the guiding bosses (142) are received in the receiving slits (242), the movement of the cover (20) is regulated so that the driving force from the driving element (30) urging the cover (20) to move relative to the base (10) is evenly distributed to both sides of the cover (20) and the movement of the cover (20) with respect to the base (10) is smooth and un-tilted. As a result, the friction damage to the cover (20) and the base (10) is reduced.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A CPU socket having a base having multiple first apertures defined through the base and each first aperture having therein a metal contact, a first recess defined in a top face thereof to receive therein a guiding plate and a first through hole defined through a bottom face defining the first recess, the guiding plate having a first hole defined to correspond to and align with the first through hole of the base, a cover having a U shaped cross section and including multiple second apertures defined through the cover to correspond to the first apertures of the base, a second recess defined in a bottom face of the cover to correspond to the first recess of the base and to receive therein a sliding plate and a second through hole defined through a bottom face defining the second recess to correspond to the first hole of the guiding plate and the first through hole of the base, the sliding plate having a second hole defined to correspond to and align with the first hole, a driving element including a head rested on top of the cover and having thereon a groove, a cam extending from a bottom of the head to abut an inner periphery of the second through hole to move the cover to move in relation to the base and a rod formed on a bottom of the cam to extend through the second through hole, the second hole, the first hole and the first through hole to combine with a disk, wherein the improvements comprise:

the guiding plate has two guiding bosses respectively formed on the guiding plate and separated by the first hole, the sliding plate has two receiving slits defined in a bottom face of the sliding plate to receive therein the two guiding bosses of the guiding plate so as to ensure smooth and un-tilted movement of the cover relative to the base.

* * * * *